United States Patent
Kronmueller et al.

(10) Patent No.: US 9,240,762 B2
(45) Date of Patent: Jan. 19, 2016

(54) METHOD AND CIRCUIT FOR IMPROVING THE SETTLING TIME OF AN OUTPUT STAGE

(71) Applicant: Dialog Semiconductor GmbH, Kirchheim/Teck-Nabern (DE)

(72) Inventors: Frank Kronmueller, Neudenau (DE); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/546,043

(22) Filed: Nov. 18, 2014

(65) Prior Publication Data

US 2015/0263683 A1    Sep. 17, 2015

(30) Foreign Application Priority Data

Mar. 13, 2014    (EP) .................................. 14159330

(51) Int. Cl.
*H03F 3/45* (2006.01)
*G05F 1/56* (2006.01)
*G05F 3/26* (2006.01)
(Continued)

(52) U.S. Cl.
CPC ............. *H03F 3/45071* (2013.01); *G05F 1/56* (2013.01); *G05F 3/262* (2013.01); *H03F 1/223* (2013.01); *H03F 1/342* (2013.01); *H03F 3/04* (2013.01); *H03F 3/16* (2013.01); *H03F 3/45381* (2013.01); *H03F 2200/129* (2013.01); *H03F 2200/408* (2013.01); *H03F 2203/45674* (2013.01)

(58) Field of Classification Search
USPC ......................................... 330/257, 288, 277
IPC ........................................................ H03F 3/45
See application file for complete search history.

(56) References Cited

U.S. PATENT DOCUMENTS 5,245,222 A * 9/1993 Carobolante ............. H03F 3/50
                                                                327/334
5,539,603 A * 7/1996 Bingham ............... H02H 9/025
                                                                361/18
(Continued)

FOREIGN PATENT DOCUMENTS

EP     0 760 555       3/1997
EP     2 031 476       3/2009

OTHER PUBLICATIONS

European Search Report, 14159330.1-1807, Mailed: Nov. 4, 2014, Dialog Semiconductor GmbH.

*Primary Examiner* — Patricia T Nguyen
(74) *Attorney, Agent, or Firm* — Saile Ackerman LLC; Stephen B. Ackerman

(57) ABSTRACT

The present document relates to amplifiers, notably multi-stage amplifiers, such as linear regulators or linear voltage regulators (e.g. low-dropout regulators) configured to provide a constant output voltage subject to load transients. An amplifier comprising an output stage for providing an output current at an output voltage, in dependence of an input voltage at a stage input node of the output stage, is described. The output stage comprises a first input transistor; wherein a gate of the first input transistor is coupled to the stage input node of the output stage. Furthermore, the output stage comprises a first diode transistor; wherein the first diode transistor is arranged in series with the input transistor. In addition, the output stage comprises a pass device configured to provide the output current at the output voltage; wherein the first diode transistor and the pass device form a current mirror.

20 Claims, 9 Drawing Sheets

(51) Int. Cl.
*H03F 3/04* (2006.01)
*H03F 3/16* (2006.01)
*H03F 1/22* (2006.01)
*H03F 1/34* (2006.01)

(56) References Cited

U.S. PATENT DOCUMENTS

| | | | | |
|---|---|---|---|---|
| 7,288,992 B2 * | 10/2007 | Birkbeck | ................ | H03C 1/36 330/296 |
| 8,816,658 B1 * | 8/2014 | De Vita | ................ | G05F 1/575 323/275 |
| 2005/0029995 A1 | 2/2005 | Benbrik | | |
| 2008/0001585 A1 * | 1/2008 | Bakkaloglu | ............ | H03F 1/086 323/280 |
| 2012/0182167 A1 | 7/2012 | Wakimoto | | |
| 2012/0299564 A1 * | 11/2012 | Howes | ................ | G05F 1/575 323/281 |

* cited by examiner

METHOD AND CIRCUIT FOR IMPROVING THE SETTLING TIME OF AN OUTPUT STAGE

TECHNICAL FIELD

The present document relates to amplifiers, notably multi-stage amplifiers, such as linear regulators or linear voltage regulators (e.g. low-dropout regulators) configured to provide a constant output voltage subject to load transients.

BACKGROUND

An example of multi-stage amplifiers are low-dropout (LDO) regulators which are linear voltage regulators which can operate with small input-output differential voltages. A typical LDO regulator 100 is illustrated in FIG. 1a. The LDO regulator 100 comprises an output amplification stage 103, e.g. a field-effect transistor (FET), at the output and a differential amplification stage or differential amplifier 101 (also referred to as error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 may be a stable voltage reference $V_{ref}$ 108 (also referred to as the bandgap reference). If the output voltage $V_{out}$ changes relative to the reference voltage $V_{ref}$, the drive voltage to the output amplification stage, e.g. the power FET, changes by a feedback mechanism called main feedback loop to maintain a constant output voltage $V_{out}$.

The LDO regulator 100 of FIG. 1a further comprises an additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bybass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output amplification stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

Usually the settling time of the output voltage $V_{out}$, subject to a load transient, is dependent on the starting load current from which a load increases up to e.g. a maximum load. Load transient responses may be distinguished between the case where the load current increases from 0 mA to the maximum load current Imax and the case where the load current increases from e.g. 1 mA to Imax. These load transient responses may be substantially different from one another. As will be outlined in the present document, this is mainly due to a substantial mirror ratio of the output stage 103 and due to a large range of output currents. Since a relatively high ratio is typically important for low current applications, the performance and stability may be defined and/or limited by this mirror ratio. In order to improve the performance and stability, nonlinear current mirrors may be used. However, it has been observed that even when using nonlinear current mirrors, the settling speed of the output voltage $V_{out}$ is still limited. As will be outlined in the present document, the limitation of the settling speed is mainly due to a relatively large load capacitance which is formed by the pass device of the output stage 103.

The present document is directed at providing amplifiers which provide an improved trade-off between stability and bandwidth (or response speed), subject to load transients. In particular, the present document addresses the technical problem of providing an output stage 103 of an amplifier 100 having a reduced settling time and an improved stability, subject to a load transient.

SUMMARY

According to an aspect, an amplifier, e.g. a multi-stage amplifier, such as a linear regulator, is described. The amplifier may comprise a plurality of amplification stages. In particular, the amplifier may comprise an output stage for providing an output current at an output voltage. The output current may be provided to a load of the amplifier. It may be beneficial to maintain the output voltage at or above a pre-determined fixed level, notably subject to a load transient. In particular, it may be beneficial to rapidly settle the output voltage at or above the pre-determined fixed level, subject to a load transient.

The output stage of the amplifier may be configured to provide the output current at the output voltage in dependence of an input voltage at a stage input node of the output stage.

The output stage (also referred to as an output amplification stage) comprises a first input transistor (e.g. a metal oxide semiconductor, MOS, transistor). A gate of the first input transistor may be coupled to the stage input node of the output stage. As such, the voltage at the gate of the first input transistor may correspond to the input voltage.

Furthermore, the output stage comprises a first diode transistor (e.g. a MOS transistor). In the present document, the term "diode transistor" is used as an alternative and/or synonym for the term "diode connected transistor" and/or for the term "transistor diode". The first diode transistor is arranged in series with the input transistor. In particular, an output node (e.g. the drain) of the first input transistor may be (directly) coupled to an output node (e.g. the drain) of the first diode transistor. In addition, the gate of the first diode transistor may be coupled to the output node (e.g. the drain) of the first diode transistor. Furthermore, the input node (e.g. the source) of the first input transistor may be (directly) coupled to a low voltage potential (e.g. to ground) of the amplifier. In addition, the input node (e.g. the source) of the first diode transistor may be (directly) coupled to a high voltage potential (e.g. to the supply voltage) of the amplifier. As such, the serial arrangement of the first input transistor and the first diode transistor may couple the high voltage potential to the low voltage potential of the amplifier.

The output stage further comprises a pass device (e.g. a MOS transistor) configured to provide the output current at the output voltage. Typically, the pass device has a dimension (e.g. a length and/or a width) which is greater by a pre-determined factor than a corresponding dimension of the first diode transistor. The pre-determined factor may be 10 or more, or 100 or more. As such, the pass device may be configured to provide an output current which is greater than a first drive current through the first diode transistor by the pre-determined factor. For this purpose, the first diode transistor and the pass device may form a current mirror. In particular, a gate of the pass device (also referred to as the gate node) may be (directly) coupled to the gate of the first diode transistor. Furthermore, an input node (e.g. the source) of the pass device may be (directly) coupled to the input node of the first diode transistor. The output current at the output voltage may be provided at the output node (e.g. the drain) of the pass device.

A midpoint between the first input transistor and the first diode transistor of the output stage is (directly) coupled to the gate node of the pass device. As such, the voltage level at the gate node may be dependent on a first input current through the first input transistor and on the first drive current through the first diode transistor. In particular, the voltage level at the gate node may be dependent on the difference between the first input current and the first drive current. This difference may correspond to the charge current flowing into or flowing out of a gate capacitance of the pass device.

The output stage further comprises a second input transistor (e.g. a MOS transistor). A gate of the second input transistor is (directly) coupled to the stage input node of the output stage. Hence, the voltage at the gate of the second input transistor may correspond to the input voltage. The second input transistor may correspond to a replica of the first input transistor. An input node (e.g. a source) of the second input transistor may be (directly) coupled to the input node of the first input transistor. In particular, an input node (e.g. a source) of the second input transistor may be (directly) coupled to the low voltage potential (e.g. to ground). An output node (e.g. the drain) of the second input transistor may be coupled to the high voltage potential (e.g. to the supply voltage), via one or more further transistors.

The second input transistor is configured to control a voltage level at a replica node of the output stage, in dependence of the input voltage. The replica node may be a replica of the gate node of the pass device. For controlling the voltage level at the replica node, the replica node may be (directly or indirectly) coupled to the output node (e.g. the drain) of the second input transistor. The replica node may not be affected by the gate capacitance of the pass device. As such, the replica node may be configured to react more rapidly to a load transient than the gate node. Hence, the voltage level at the replica node may be used to reduce the settling time of the output voltage.

In addition, the output stage comprises a buffer transistor (e.g. a MOS transistor). A gate of the buffer transistor is (directly) coupled to the replica node and an input node (e.g. the source) of the buffer transistor is (directly) coupled to the gate node. Furthermore, an output node (e.g. the drain) of the buffer transistor may be (directly) coupled to the low voltage potential. The buffer transistor may be configured to sink or source a charge current at the gate node, subject to the voltage level at the replica node and the voltage level at the gate node. In particular, the buffer transistor may be configured to sink or source a charge current at the gate node in dependence of a difference between the voltage level at the replica node and the voltage level at the gate node.

Hence, the output stage is configured to sink or source a substantial portion of the charge current for charging/discharging the gate capacitance of the pass device using the buffer transistor. By doing this, the speed for building up a conductive channel within the pass device may be increased. Furthermore, the difference between the first input current (through the first input transistor) and the first drive current (through the first diode transistor) may be reduced, thereby increasing the first drive current (through the first diode transistor) and consequently increasing the output current (through the pass device). This leads to a reduction of the settling time of the output voltage, subject to a load transient.

The output stage may further comprise a first auxiliary diode transistor and a second auxiliary diode transistor, which may be arranged in series with each other and with the second input transistor. This serial arrangement may be arranged in parallel to the serial arrangement of the first input transistor and of the first diode transistor. The replica node may correspond to a midpoint of the first auxiliary diode transistor and of the second auxiliary diode transistor. This midpoint may not be (directly) coupled to the gate node. In other words, the first auxiliary diode transistor and the second auxiliary diode transistor may not be affected by the gate capacitance of the pass device. As a result of this, the replica node may be configured to react rapidly to a load transient. In particular, the voltage level at the replica node may be reduced rapidly subject to a load transient. Even more particularly, the voltage level at the replica node may reduce more rapidly than the voltage level at the gate node, thereby providing a gate-source voltage at the buffer transistor and thereby allowing the buffer transistor to source or sink the charge current for the gate capacitance of the pass device.

An input node (e.g. the source) of the first auxiliary diode transistor may be (directly) coupled to the replica node and an output node (e.g. the drain) of the first auxiliary diode transistor may be (directly) coupled to a gate of the first auxiliary diode transistor. The gate of the first auxiliary diode may be (directly) coupled to the gate of the buffer transistor. As such, the voltage level at the replica node may impact the voltage level at the gate of the buffer transistor.

Furthermore, an input node (e.g. the source) of the second auxiliary diode transistor may be (directly) coupled to an input node (e.g. the source) of the first diode transistor. In particular, the input node of the second auxiliary diode transistor may be (directly) coupled to the high voltage potential. An output node (e.g. the drain) of the second auxiliary diode transistor may be (directly) coupled to a gate of the second auxiliary diode transistor. The gate of the second auxiliary diode transistor may be (directly) coupled to the replica node.

As such, the voltage level at the replica node may be controlled using the first and second auxiliary diode transistors. The voltage level at the replica node may affect the gate-source voltage of the buffer transistor, thereby affecting the level of the charge current which is sunk or sourced by the buffer transistor. Due to the fact that the first and second auxiliary diode transistors are not affected by the gate capacitance of the pass device, the voltage level at the replica node may change rapidly, subject to a load transient, thereby changing the gate-source voltage at the buffer transistor. As a result of this, the charge current for sinking or sourcing the gate capacitance of the pass device may be provided in a rapid manner, thereby reducing the settling time of the output voltage of the output stage (and of the amplifier).

Alternatively or in addition, the output stage may comprise a sense transistor (e.g. a MOS transistor) configured to provide a sense current at the replica node such that the sense current is dependent on the output current. In particular, the sense current may be proportional to the output current flowing through the pass device. For this purpose, a gate of the sense transistor may be (directly) coupled to the gate node. Furthermore, an input node (e.g. the source) of the sense transistor may be (directly) coupled to the high voltage potential. In particular, the input node of the sense transistor may be (directly) coupled to the input node of the pass device. As such, the sense transistor and the pass device may form a current mirror.

The sense transistor may be arranged in series with the second input transistor. This serial arrangement may be arranged in parallel to the serial arrangement of the first input transistor and of the first diode transistor. For this purpose, the input node of the sense transistor may be (directly) coupled to an input node of the first diode transistor. Furthermore, an output node (e.g. the drain) of the sense transistor may be (directly) coupled to the output node (e.g. the drain) of the second input transistor. This midpoint between the second input transistor and the sense transistor may correspond to the replica node. Furthermore, this midpoint may be (directly) coupled to the gate of the buffer transistor. As such, the voltage level at the replica node may directly impact the gate-source voltage of the buffer transistor, thereby affecting the charge current sourced or sunk by the buffer transistor.

As outlined above, the current through the sense transistor depends of the output current. As such, an increase of the output current directly impacts the current through the sense transistor and by consequence the voltage level of the replica node. In particular, a delayed increase of the output current leads to a decrease of the voltage level of the replica node, thereby closing the buffer transistor for sinking or sourcing the charge current. As a consequence, the settling time of the output voltage of the output stage and of the amplifier may be reduced.

The first and second input transistors may comprise N-type metal oxide semiconductor field effect transistors, the first diode transistor may comprise a P-type metal oxide semiconductor field effect transistor and/or the buffer transistor may comprise a P-type metal oxide semiconductor field effect transistor.

As indicated above, the amplifier may be a multi-stage amplifier. In particular, the amplifier may comprise a first amplification stage (which is different from the output stage). The first amplification stage may comprise a differential amplification stage. The first amplification stage may be configured to provide a stage output voltage at a stage output node of the first amplification stage. The stage output node of the first amplification stage may be (directly or indirectly) coupled to the stage input node of the output stage.

Furthermore, the amplifier may comprise voltage sensing means (e.g. a voltage divider) configured to provide an indication of the output voltage. The indication of the output voltage may be fed back to an input of the first amplification stage. The feedback may be used to regulate the output voltage.

According to a further aspect, a method for reducing the settling time of an output voltage at the output of an output stage of an amplifier, subject to a load transient, is described. The output stage comprises a first input transistor, wherein a gate of the first input transistor is (directly) coupled to a stage input node of the output stage. Furthermore, the output stage comprises a first diode transistor, wherein the first diode transistor is arranged in series with the input transistor. In addition, the output stage comprises a pass device configured to provide an output current at the output voltage, wherein the first diode transistor and the pass device form a current mirror, and wherein a midpoint between the first input transistor and the first diode transistor is coupled to a gate node of the pass device. Furthermore, the output stage comprises a second input transistor, wherein a gate of the second input transistor is coupled to the stage input node of the output stage. The output stage further comprises a buffer transistor, wherein a gate of the buffer transistor is coupled to the replica node and wherein an input node of the buffer transistor is coupled to the gate node.

The method comprises controlling a voltage level at the gate node of the pass device using the first input transistor. Furthermore, the method comprises controlling a voltage level at the replica node using the second input transistor. In addition, the method comprises sinking or sourcing a charge current at the gate node using the buffer transistor, based on the voltage level at the replica node and the voltage level at the gate node.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
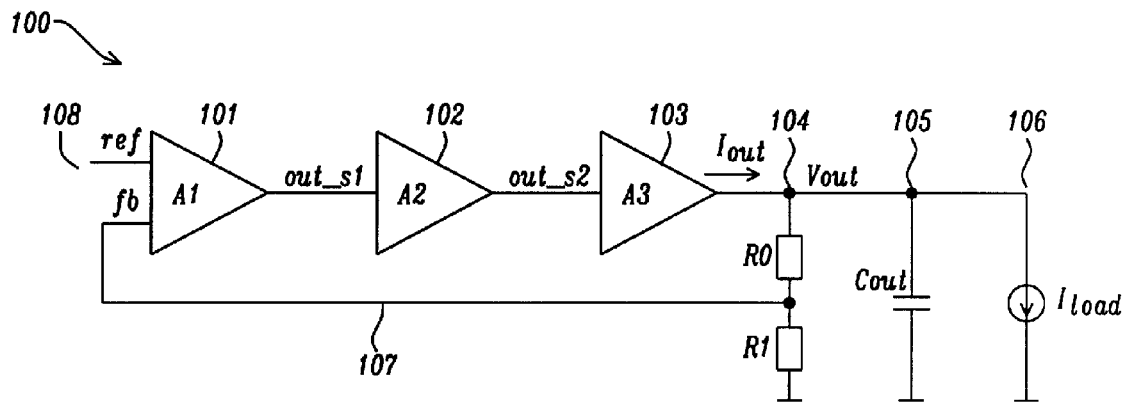
FIG. 1a illustrates an example block diagram of an LDO regulator.
Figure 1B:
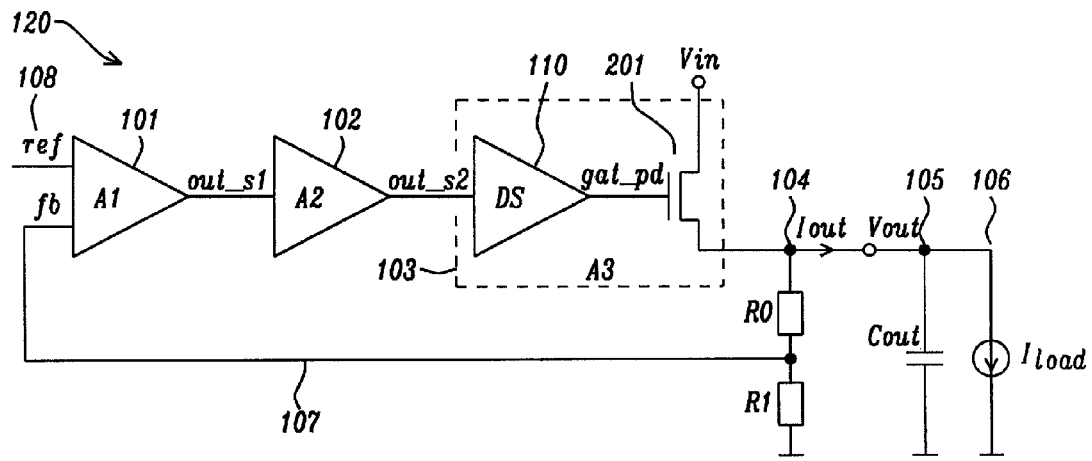
FIG. 1b illustrates the example block diagram of an LDO regulator in more detail.

As already outlined above, FIG. 1a shows an example block diagram for an LDO regulator 100 with its three amplification stages A1, A2, A3 (reference numerals 101, 102, 103, respectively). FIG. 1b illustrates the block diagram of a LDO regulator 120, wherein the output amplification stage A3 (reference numeral 103) is depicted in more detail. In particular, the pass transistor or pass device 201 and the driver stage 110 of the output amplification stage 103 are shown. Typical parameters of an LDO regulator are a supply voltage of 3V, an output voltage of 2V, and an output current or load current ranging from 0 mA or 1 mA to 100 or 200 mA or 1 A. Other configurations are possible. The present invention is described in the context of a linear regulator. It should be noted, however, that the present invention is applicable to amplifiers, notably multi-stage amplifiers, in general.

It is desirable to provide a multi-stage amplifier such as the regulator 100, 120, which is configured to generate a stable output voltage $V_{out}$ subject to load transients. The output capacitor 105 may be used to stabilize the output voltage $V_{out}$, because in case of a load transient, an additional load current $I_{load}$ may be provided by the output capacitor 105. Furthermore, schemes such as Miller compensation and/or load current dependent compensation may be used to stabilize the output voltage $V_{out}$.

At the same time, it is desirable to provide a multi-stage amplifier with a high bandwidth. The above stabilization schemes may lead to a reduction of the speed of the multi-stage amplifier. Overall, it is desirable to provide a multi-stage amplifier with a reduced settling time of the output voltage $V_{out}$ (i.e. with an increased speed) and an increased stability, subject to a load transient.

Figure 2:
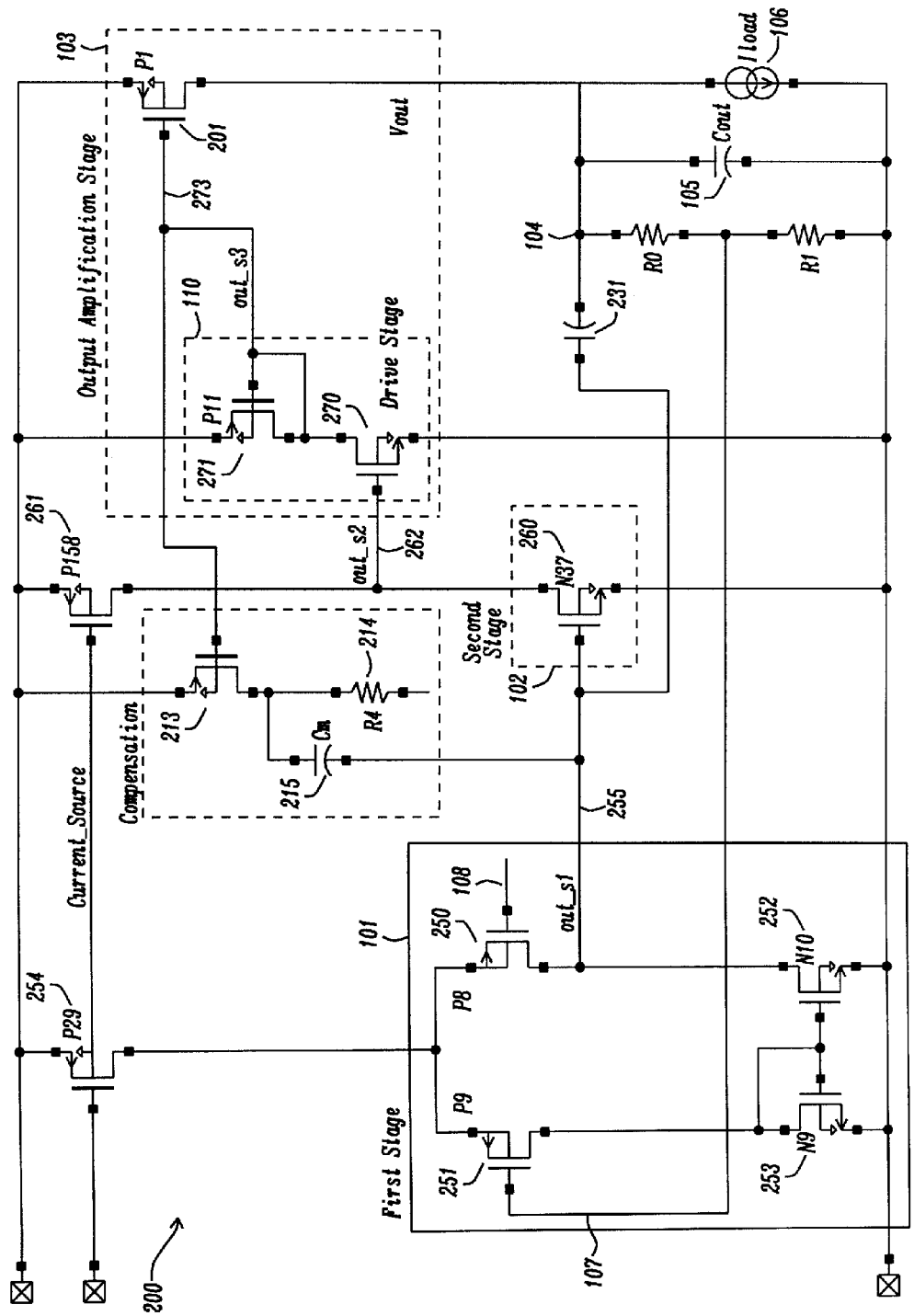
FIG. 2 shows an example circuit arrangement of an LDO regulator.

FIG. 2 illustrates an example circuit arrangement of an LDO regulator 200 comprising a Miller compensation using a capacitance $C_V$ 231 and a load current dependent compensation comprising a current mirror with transistors 201 (corresponding to the pass transistor 201) and 213, a compensation resistor 214 and a compensation capacitance $C_m$ 215.

The circuit implementation of FIG. 2 can be mapped to the block diagrams in FIGS. 1a and 1b, as similar components have received the same reference numerals. In the circuit arrangement 200, the differential amplification stage 101, the intermediate amplification stage 102 and the output amplification stage 103 are implemented using field effect transistors (FET), e.g. metal oxide semiconductor FETs (MOSFETs).

The differential amplification stage 101 comprises the differential input pair of transistors P9 251 and P8 250, and the current mirror N9 253 and N10 252. The input of the differential pair is e.g. a 1.2V reference voltage 108 at P8 and the feedback 107 at P9 which is derived from the resistive divider 104 (with e.g. R0=0.8 MΩ and R1=1.2 MΩ).

The intermediate amplification stage 102 comprises a transistor N37 260, wherein the gate of transistor N37 260 is coupled to the stage output node 255 of the differential amplification stage 101. The transistor P158 261 acts as a current source for the intermediate amplification stage 102, similar to transistor P29 254 which acts as a current source for the differential amplification stage 101.

The output amplification stage 103 is coupled to the stage output node 262 of the intermediate amplification stage 102 and comprises a pass device or pass transistor 201 and a gate driver stage 110 for the pass device 201, wherein the gate driver stage comprises a transistor 270 and a transistor P11 271 connected as a diode. This gate driver stage has essentially no gain since it is low-ohmic through the transistor diode P11 271 which yields a resistance of $1/g_m$ (output resistance of the driver stage 110 of the output amplification stage 103) to signal ground. The gate of the pass transistor 201 is identified in FIG. 2 with reference numeral 273.

In the present document, circuitry is described which may be used to increase the settling speed of an output stage 103, subject to a load transient, while at the same time ensuring stability of the amplifier 100. The described circuitry may be implemented in a cost and power efficient manner.

Figure 3A:
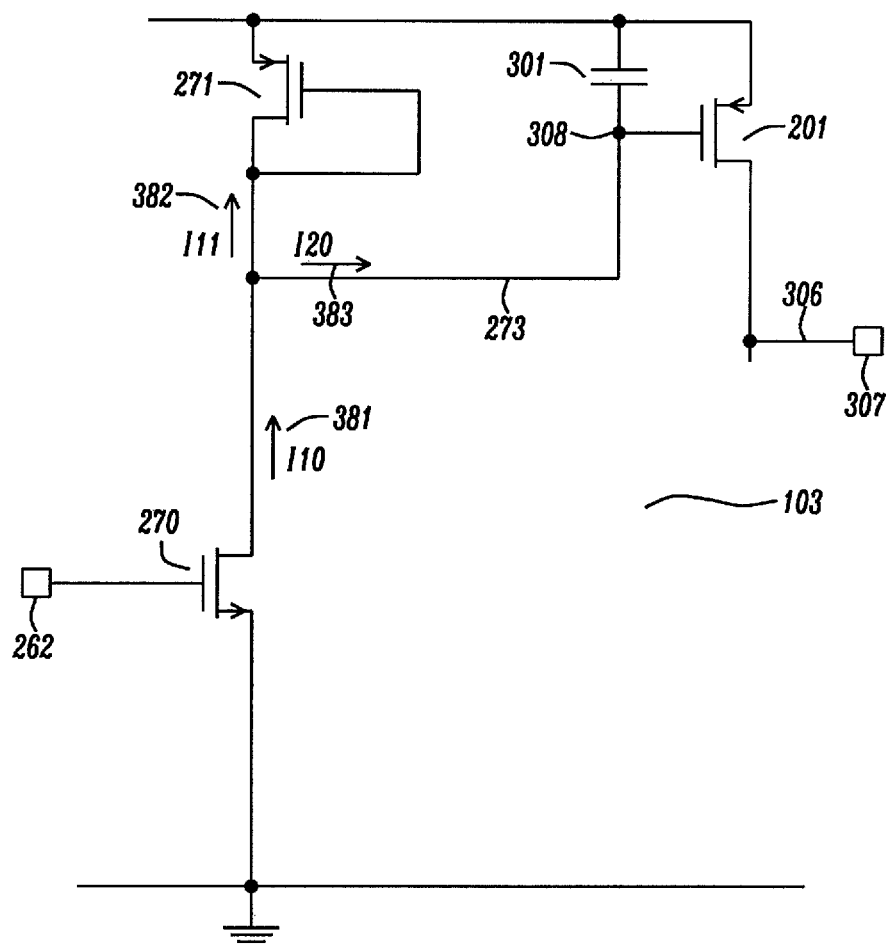
FIG. 3a shows a circuit diagram of an example output stage of an amplifier.

FIG. 3a shows a circuit diagram of an example output stage 103 comprising a stage input node 262 (which corresponds to and/or which is coupled to the stage output node 262 of the preceding stage 102 of the amplifier 100). The output stage 103 is configured to provide an output voltage $V_{out}$ 306 subject to an input voltage which is applied to the stage input node 262. For this purpose, the output stage 103 comprises a pass device 201 which forms a current mirror with the transistor diode 271 (also referred to as a first diode connected transistor in the present document). Typically, the mirror ratio of the current mirror 271, 201 is relatively large. In other words, typically, the pass device 201 is substantially larger than the transistor diode 271. As a result of this, the pass device 201 typically comprises a substantial gate capacitance 301, which is explicitly shown in FIG. 3a for illustration purposes.

The input transistor 270 (also referred to as the first input transistor) of the output stage 103 is controlled by one or more preceding amplifier stages 101, 102 (not shown in FIG. 3a) and drives a current $I_{10}$ 381 into the upper transistor 271 which acts as a diode (i.e. into the transistor diode 271). The capacitor 301 represents the effective capacitance seen at the gate of the pass device 201. The multiplied current 106 of the pass device 201 is provided as output current 106 at the output node 307 of the output stage 103. The output current 106 typically corresponds to the current $I_{11}$ 382, multiplied by the mirror ratio of the current mirror 271, 201.

The capacitance 301 is dominantly loading the node 308 (i.e. the gate of the pass device 201), therefore causing a delayed and bandwidth limited response, when the input transistor 270 is driven to charge the output node 307 with an increased output current. This forms an additional pole at the node 308 (also referred to as the gate node), which may impact the overall stability of the output stage 103 and/or of the amplifier 100. A possibility to addressing this stability issue may be to move the addition pole out by using a reduced mirror ratio. This, however, would substantially increase the current consumption and the power losses of the amplifier 100. Alternatively, stability could be achieved by reducing the size of the pass device 201. This, however, would sacrifice the dropout conditions of the amplifier 100.

When analyzing the circuit in a transient step situation, it can be observed that the charge current 383 out of the gate of the pass device 201 is not small compared to the drive current 381, especially when starting from a zero load current or from a relatively low load current. In particular, it can be seen that the charge current 383 exhibits a peak before the internal channel of the pass device 201 is built up and before a significant output current 106 starts to flow. Since the (dis-)charge current $I_{20}$ 383 is limited by the input current 381 through the input transistor 270 a delayed response of the gate node 308 may be observed.

In other words, it has been observed that a significant portion of the input current $I_{10}$ 381 through the input transistor 270 is used as a charge current $I_{20}$ 383 to charge or discharge the gate capacitance 301 in order to build up a conduction channel within the pass device 201. As a result of this, the drive current $I_{11}$ 382 into the transistor diode 271 is reduced, thereby reducing the output current 106 which is provided at the output node 307 of the output amplification stage 103. This leads to a relatively long settling time for the output voltage 306 at the output node 307.

In order to reduce the settling time, a buffer may be added to the output stage 103. The buffer may be configured to sink or source an additional charge current from/to the gate node 308 in order to improve the bandwidth, the settling time and/or the stability of the output stage 103. By using such a buffer, only a relatively small additional current is used by the output stage 103, thereby providing a power efficient output stage 103.

In particular, it is proposed to provide a replica gate driver node (also referred to as a replica node) which is not loaded by the capacitance 301 of the pass device 201. As such, the replica gate driver node may be configured to react rapidly (i.e. with a high bandwidth) to a load transient. Furthermore, a buffer may be provided to deliver or to sink at least part of the charge current 383 which is needed to build up the channel charge of the pass device 201, i.e. which is needed to charge or discharge the gate capacitance 301 of the pass device 201. The buffer may be configured to sense the difference between the voltage levels at the gate driver node 308 and at the replica gate driver node. Furthermore, the buffer may be configured to deliver or sink an additional current to/from the gate 308 of the pass device 201, based on the difference between the voltage levels at the gate driver node 308 and at the replica gate driver node, in order to minimize this difference.

Figure 3B:
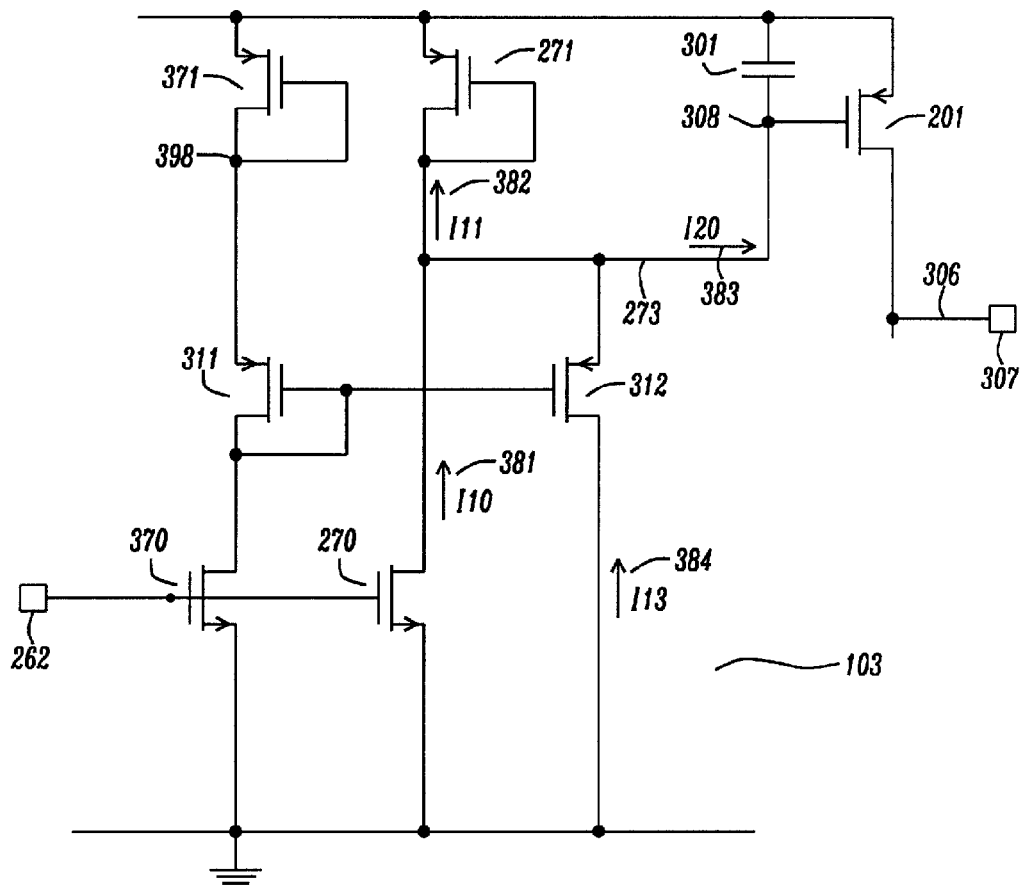
FIG. 3b shows a circuit diagram of an example output stage comprising a diode driven buffer.

FIG. 3b shows a circuit diagram of an example output stage 103 comprising a buffer (e.g. a buffer transistor) 312. The buffer 312 may be configured to provide and/or to sink a relatively large current to and/or from the gate node 308. The buffer 312 may be driven by the diode connected transistors 371, 311 using the additional input transistor 370. The diode connected transistor 311 is also referred to as the first auxiliary diode connected transistor 311 and the diode connected transistor 371 is also referred to as the second auxiliary diode connected transistor 371.

The transistors 370 and 271 form a replica node 398 which is a replica of the gate node 308 of the output driver stage. In contrast to the gate node 308, the replica node 398 is not loaded with a large capacitive load 301. Consequently, the replica node 398 exhibits a relatively fast response to load transients.

The transistor 311 is connected to the replica node 398 in a diode configuration in order to form a suitable operating point to drive the buffer 312. This forms a translinear circuit which allows for a wide range of operation conditions, depending on the actual scaling of the first auxiliary diode connected transistor 311 and of the buffer transistor 312.

In case of a positive load change, the first input transistor 270 and the second input transistor 370 increase their respective input currents. The actual first drive current 382 into the first diode transistor 271 is relatively small at a time instant directly subsequent to the load transient, because of the loading effect of the pass device 201 and its capacitance 301. However, the second input current of the additional second input transistor 370 is fully driven into the additional diode connected transistor 371, causing the replica gate node 398 to drop rapidly.

As a result of this, the buffer transistor 312 is submitted to an increased difference of the gate-source voltage Vgs, causing an extra current to be pulled off the gate node 308, thereby supporting the channel built-up in the pass device 201. Consequently, the speed of the channel built-up is increased and the output current 106 increases more rapidly. As soon as the channel is established, the charge current 383 to follow the current rise is negligible small compared to the first drive current 382. Then the full input current 381 is taken up by the first diode connected transistor 271 and the output current 106 is driven towards its final value.

An appropriate scaling of the transistors ensures that the additional current which is used up for the replica driver is well defined and relatively small. The ratio of the input transistors 270, 370, of the diode transistors 271, 371, and of the transistors 311, 312 define the overall gain of the buffer. As will be outlined in the context of FIGS. 4a, 4b and 4c, simulations indicate that the current step response settles faster and causes less undershoot of the output voltage 306, when using a buffer 312. Furthermore, the phase margin may be increased by using a buffer circuit 312, because the output pole is moved outwards by the additional transconductance of the buffer 312. The total achievable voltage swing on the gate node 308 is not limited by the buffer 312, because the first input transistor 270 is still connected to the gate node 308 and configured to drive the gate node 308 to low level, even when the buffer 312 can no longer conduct a current.

In other words, FIG. 3b shows a circuit diagram comprising a buffer transistor 312 which may be used to provide and/or to sink a charge current 383 for the gate capacitance 301 of the pass device 201. The buffer transistor 312 may comprise a p-type MOS transistor. The gate of the buffer transistor 312 may be coupled to the replica gate node 398, the source of the buffer transistor 312 may be coupled to the gate node 308 and the drain of the buffer transistor 312 may be coupled to ground.

The additional second input transistor 370 is arranged in parallel to the first input transistor 270, and the gate of the additional second input transistor 370 is coupled to the stage input node 262. The second input transistor 370 drives the two diode connected transistors 311, 371, wherein a midpoint between the two diode connected transistors 311, 371 corresponds to the replica gate node 398. Due to the fact that the upper diode connected transistor 371 is not loaded, the replica gate node 398 is pulled down rapidly, subject to a load transient, thereby leading to a differential voltage between the voltage level of the replica gate node 398 and the gate node 308. This differential voltage causes the buffer transistor 312 to open and to allow for a buffer current $I_{13}$ 384 for supporting the required charge current 383. As a result of this, the first input transistor 270 is relieved from providing/sinking the charge current 383.

Figure 3C:
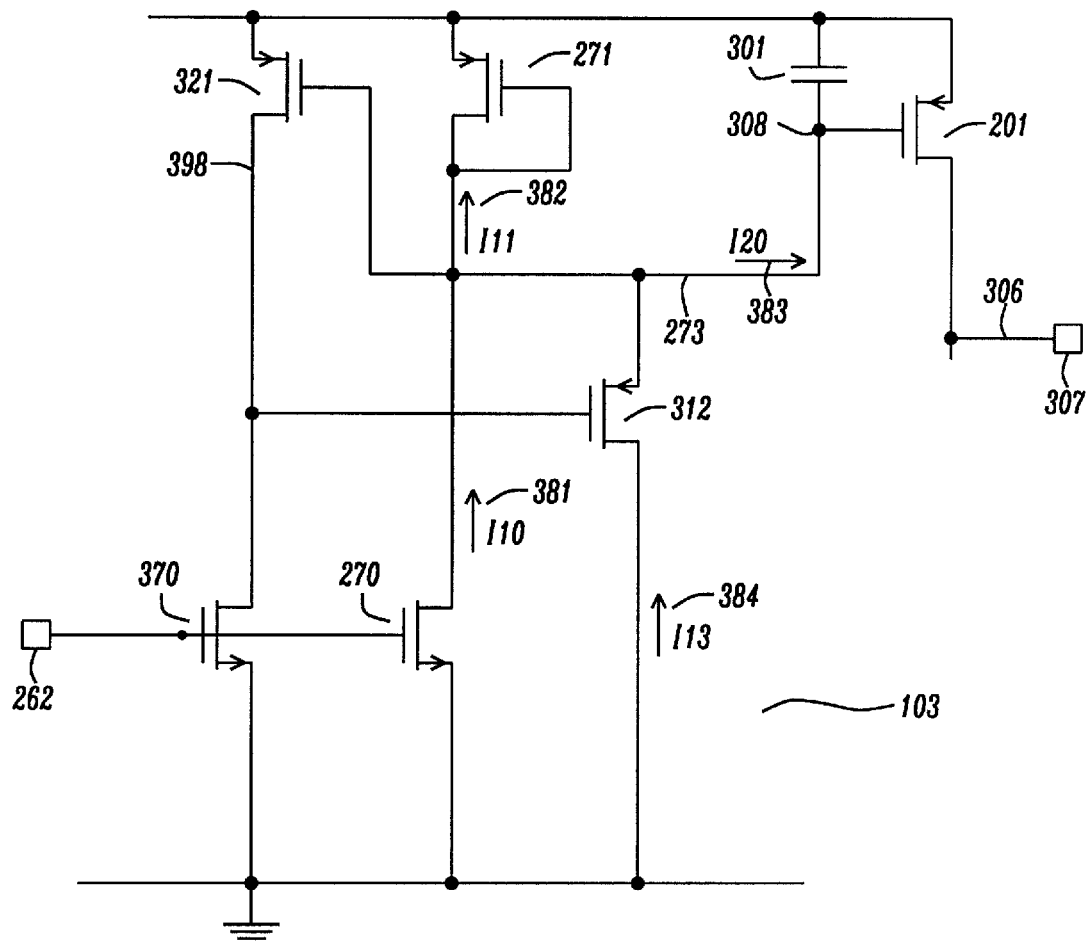
FIG. 3c shows a circuit diagram of an example output stage comprising an amplifier driven buffer.

FIG. 3c shows a circuit diagram of another output stage 103. In the output stage 103 of FIG. 3c, the replica diode connected transistors 311, 371 are replaced with a sense transistor 321 which mirrors a fraction of the actual output current 106 to the replica node 398. The sense transistor 321 together with the second input transistor 370 forms an amplifier with an output at the replica node 398.

If the channel in the pass device 201 is not built up, then there is no substantial output current 106 and by consequence, no substantial current from the sense transistor 321. Consequently, the replica node 398 is discharged by the second input transistor 370, leading to a reduction of the voltage level of the replica node 398. The voltage difference between the voltage level at the replica node 398 and the voltage level at the gate node 308 is driving the buffer 312 helping to discharge the gate node 308. As soon the channel of the pass device 201 is established, the replica node 398 is pulled up and stabilized on its final operating point, which is defined by the ratio of the transistors 370, 270 and of the transistors 321, 271. The current through the buffer 312 may be given by $I_{13}=I_{10}*((P10/P14)-(N10/N11))$, wherein P10/P14 is the size ratio of the diode connected transistor 271 (P10) and the sense transistor 321 (P14), and wherein N10/N11 is the size ratio of the first input transistor 270 (N10) and the second input transistor 370 (N11). In static operation, the sense transistor 321 may be acting with the buffer transistor 312 as a virtual diode, thereby creating a threshold voltage ($V_{th}$)-shifted replica node 398.

Figure 4A:
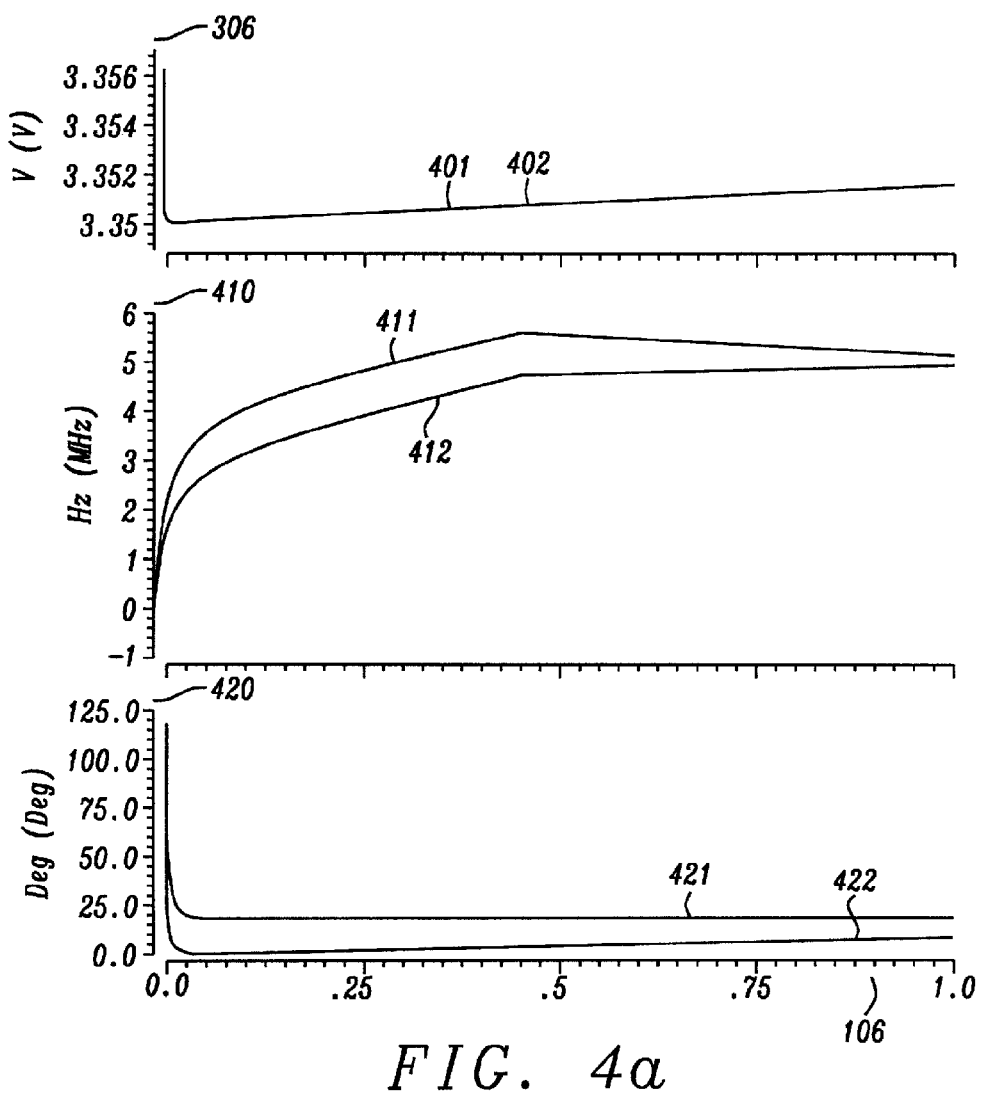
FIGS. 4a, 4b and 4c show example measurements of an amplifier comprising a buffer.

FIG. 4a illustrates the beneficial effect on the phase margin 420 in a worst case situation, where the phase margin 420 of the un-buffered output stage 103 (see FIG. 3a) drops as low as 1-2 degrees (see curve 422). FIG. 4a shows the situation of a load current 106 which increases from 0 A to 1 A. Using the amplifier driven buffer 312 (as shown in FIG. 3c) the phase margin 420 may be increase to 20 degrees (see curve 421). The static output voltage remains unaffected, as can be seen by the overlapping curves 401, 402. Furthermore, the bandwidth 410 is increased, when the buffer structure is used (see curve 411 in comparison with curve 412). Because the phase margin 420 is also increased, this means that a limiting pole is moved outwards when using a buffer 312.

Figure 4B:
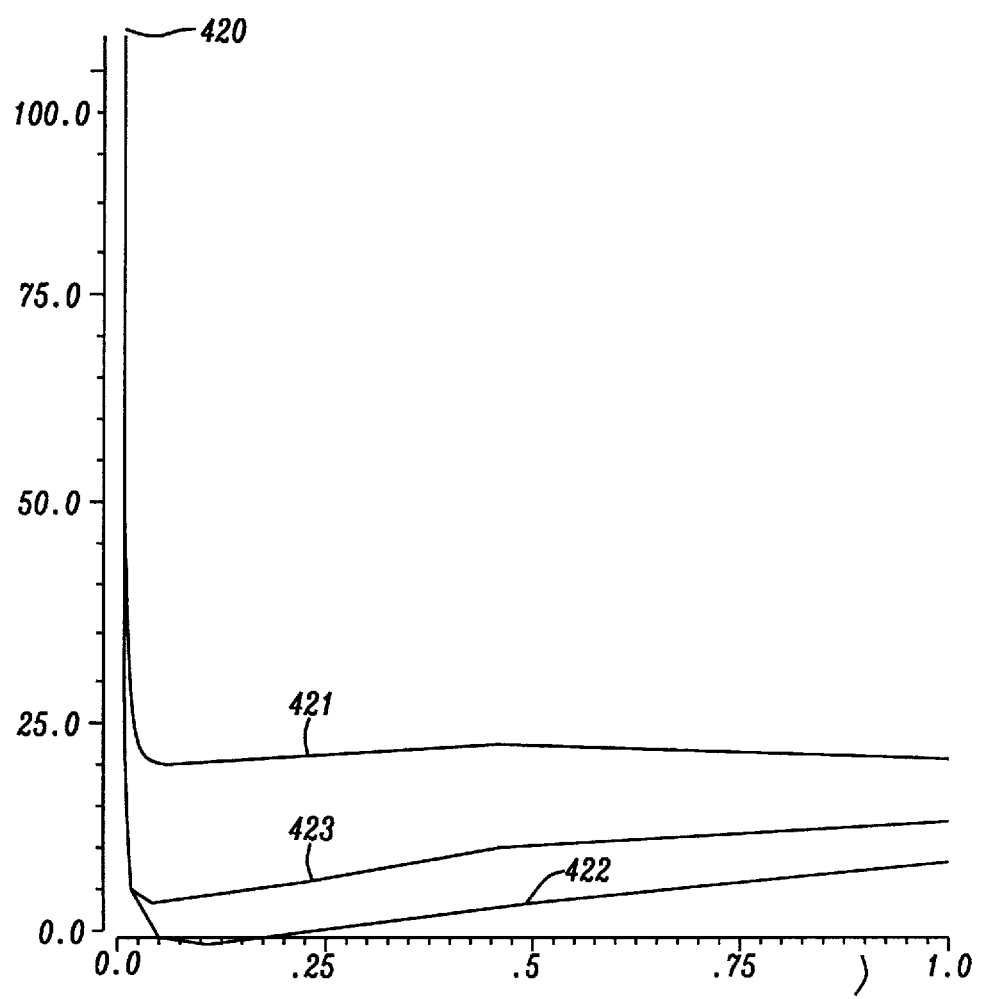

The improvement of the phase margin 420 is further illustrated in FIG. 4b. In particular, it can be seen that the phase margin 420 without buffer 312 drops to ~1.1 deg (curve 422), whereas the phase margin 420 is at ~7.5 deg when using a diode-driven buffer 312 as shown in FIG. 3b (see curve 423), and at ~21 deg, when using an amplifier-driven buffer as shown in FIG. 3c (see curve 421).

Figure 4C:
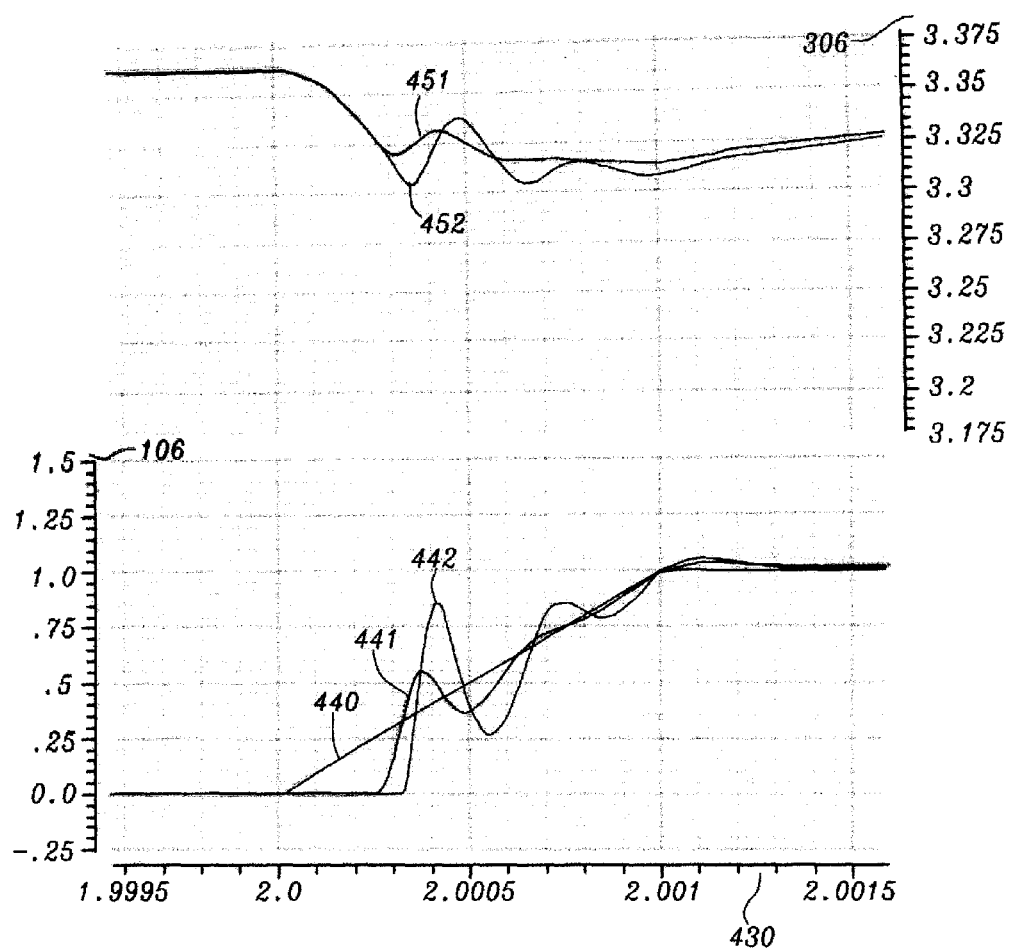

FIG. 4c shows typical transient load/voltage and current regulation waveforms. In particular, FIG. 4c shows the responses of the output voltage 306 and the output current 106 subject to a load-step 440 from 10 μA-1 A within 1 μs of time 430. It can clearly be seen that the amplifier-buffered output stage 103 (curves 451, 441) reacts faster, with less delay and with less overshoot for the current than the un-buffered output stage 103 (curves 452, 442). These results in reduced voltage undershoot of the output voltage 306. The regulation into the static load remains unaffected by the buffer 312 and is the same for both cases.

Figure 5:
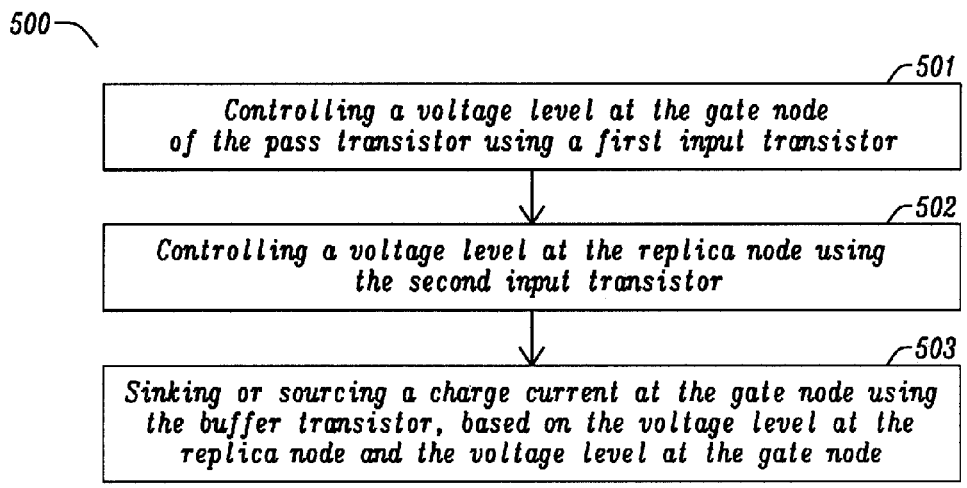
FIG. 5 shows a flow chart of an example method for reducing the settling time of the output voltage of an amplifier.

FIG. 5 shows a flow chart of an example method 500 for reducing the settling time of an output voltage 306 at the output of an output stage 103 of an amplifier 100, 200, subject to a load transient. The output stage 103 comprises a first input transistor 270. As illustrated in FIGS. 3b and 3c the gate of the first input transistor 270 is coupled to the stage input node 262 of the output stage 103. Furthermore, the output stage 103 comprises a first diode transistor 271, wherein the first diode transistor 271 is arranged in series with the input transistor 270. The output stage 103 further comprises a pass device 201 which is configured to provide an output current 106 at the output voltage 306. The first diode transistor 271 and the pass device 201 form a current mirror and a midpoint between the first input transistor 270 and the first diode transistor 271 is coupled to a gate node 308 of the pass device 201. In addition, the output stage 103 comprises a second input transistor 370, wherein a gate of the second input transistor 370 is coupled to the stage input node 262 of the output stage 103. Furthermore, the output stage 103 comprises a buffer transistor 312, wherein a gate of the buffer transistor 312 is coupled to the replica node 398 and wherein an input node of the buffer transistor 312 is coupled to the gate node 308.

The method 500 comprises controlling 501 a voltage level at the gate node 308 of the pass device 308 using the first input transistor 270. Typically, the voltage level at the gate node 308 depends on the input voltage at the stage input node 262 of the output stage 103. Furthermore, the method 500 comprises controlling 502 a voltage level at the replica node 398 using the second input transistor 370. Typically, the voltage level at the replica node 398 depends on the input voltage at the stage input node 262 of the output stage 103. In addition, the method 500 comprises sinking or sourcing 503 a charge current 383, 384 at the gate node 308 using the buffer transistor 312, based on the voltage level at the replica node 398 and the voltage level at the gate node 308. In particular, the charge current 383, 384 may be sunk or sourced based on the difference between the voltage level at the replica node 398 and the voltage level at the gate node 308. As a result of this, a substantial fraction of the charge current 383 charging and/or discharging the gate capacitance 301 of the pass device 201 may be handled by the buffer transistor 312, thereby reducing the settling time of the output voltage 306.

In the present document, circuitry for an output stage of an amplifier has been described. The circuitry may be used to reduce the settling time of the output voltage of the output stage and to increase the stability of the amplifier, subject to a load transient. The circuitry is particularly beneficial for load transients with a relatively low starting value, e.g. 0 mA. The circuitry takes up only relatively little additional current, thereby providing a power efficient output stage.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An amplifier comprising an output stage for providing an output current at an output voltage, in dependence of an input voltage at a stage input node of the output stage; wherein the output stage comprises
   a first input transistor; wherein a gate of the first input transistor is coupled to the stage input node of the output stage;
   a first diode transistor; wherein the first diode transistor is arranged in series with the input transistor;
   a pass device configured to provide the output current at the output voltage; wherein the first diode transistor and the pass device form a current mirror; wherein a midpoint between the first input transistor and the first diode transistor is coupled to a gate node of the pass device;
   a second input transistor; wherein a gate of the second input transistor is coupled to the stage input node of the output stage; wherein the second input transistor is configured to control a voltage level at a replica node, in dependence of the input voltage; and
   a buffer transistor; wherein a gate of the buffer transistor is coupled to the replica node and wherein an input node of the buffer transistor is coupled to the gate node, such that the buffer transistor is configured to sink or source a charge current at the gate node, subject to the voltage level at the replica node and the voltage level at the gate node.

2. The amplifier of claim 1, wherein the output stage further comprises a first auxiliary diode transistor and a second auxiliary diode transistor which are arranged in series with each other and with the second input transistor; wherein the replica node corresponds to a midpoint of the first auxiliary diode transistor and the second auxiliary diode transistor.

3. The amplifier of claim 2, wherein
an input node of the first auxiliary diode transistor is coupled to the replica node; and
an output node of the first auxiliary diode transistor is coupled to a gate of the first auxiliary diode transistor, which is coupled to the gate of the buffer transistor.

4. The amplifier of claim 2, wherein
an input node of the second auxiliary diode transistor is coupled to an input node of the first diode transistor; and
an output node of the second auxiliary diode transistor is coupled to a gate of the second auxiliary diode transistor, which is coupled to the replica node.

5. The amplifier of claim 1, wherein the output stage further comprises a sense transistor configured to provide a sense current at the replica node such that the sense current is dependent on the output current; wherein the sense transistor is arranged in series with the second input transistor.

6. The amplifier of claim 5, wherein a gate of the sense transistor is coupled to the gate node.

7. The amplifier of any of claim 5, wherein
an input node of the sense transistor is coupled to an input node of the first diode transistor; and
an output node of the sense transistor is coupled to an output node of the second input transistor, which is coupled to the gate of the buffer transistor.

8. The amplifier of claim 1, wherein the voltage level at the gate node is dependent on a first input current through the first input transistor and on a first drive current through the first diode transistor.

9. The amplifier of claim 1, wherein
the first and second input transistors comprise N-type metal oxide semiconductor field effect transistors;
the first diode transistor comprises a P-type metal oxide semiconductor field effect transistor; and/or
the buffer transistor comprises a P-type metal oxide semiconductor field effect transistor.

10. The amplifier of claim 1, further comprising
a first amplification stage configured to provide a stage output voltage at a stage output node of the first amplification stage; wherein the stage output node of the first amplification stage is coupled to the stage input node of the output stage; and
voltage sensing means configured to provide an indication of the output voltage; wherein the indication of the output voltage is fed back to an input of the first amplification stage.

11. The amplifier of claim 10, wherein the first amplification stage comprises a differential amplification stage.

12. A method for reducing the settling time of an output voltage at the output of an output stage of an amplifier, subject to a load transient; wherein the output stage comprises
a first input transistor; wherein a gate of the first input transistor is coupled to a stage input node of the output stage;
a first diode transistor; wherein the first diode transistor is arranged in series with the input transistor;
a pass device configured to provide an output current at the output voltage; wherein the first diode transistor and the pass device form a current mirror; wherein a midpoint between the first input transistor and the first diode transistor is coupled to a gate node of the pass device;
a second input transistor; wherein a gate of the second input transistor is coupled to the stage input node of the output stage; and
a buffer transistor; wherein a gate of the buffer transistor is coupled to the replica node and wherein an input node of the buffer transistor is coupled to the gate node;
wherein the method comprises
controlling a voltage level at the gate node of the pass device using the first input transistor;
controlling a voltage level at the replica node using the second input transistor; and
sinking or sourcing a charge current at the gate node using the buffer transistor, based on the voltage level at the replica node and the voltage level at the gate node.

13. The method of claim 12 wherein the output stage further comprises a first auxiliary diode transistor and a second auxiliary diode transistor which are arranged in series with each other and with the second input transistor;
wherein the replica node corresponds to a midpoint of the first auxiliary diode transistor and the second auxiliary diode transistor.

14. The method of claim 12 amplifier wherein
an input node of the first auxiliary diode transistor is coupled to the replica node; and
an output node of the first auxiliary diode transistor is coupled to a gate of the first auxiliary diode transistor, which is coupled to the gate of the buffer transistor.

15. The method of claim 12, wherein
an input node of the second auxiliary diode transistor is coupled to an input node of the first diode transistor; and
an output node of the second auxiliary diode transistor is coupled to a gate of the second auxiliary diode transistor, which is coupled to the replica node.

16. The method of claim 12, wherein the output stage further comprises a sense transistor configured to provide a sense current at the replica node such that the sense current is dependent on the output current; wherein the sense transistor is arranged in series with the second input transistor.

17. The method of claim 16, wherein a gate of the sense transistor is coupled to the gate node.

18. The method of any of claim 16, wherein
an input node of the sense transistor is coupled to an input node of the first diode transistor; and
an output node of the sense transistor is coupled to an output node of the second input transistor, which is coupled to the gate of the buffer transistor.

19. The method of claim 12, wherein the voltage level at the gate node is dependent on a first input current through the first input transistor and on a first drive current through the first diode transistor.

20. The method of claim 12, wherein
the first and second input transistors comprise N-type metal oxide semiconductor field effect transistors;
the first diode transistor comprises a P-type metal oxide semiconductor field effect transistor; and/or
the buffer transistor comprises a P-type metal oxide semiconductor field effect transistor.

* * * * *